United States Patent [19]

Mazura et al.

[11] Patent Number: 5,441,337
[45] Date of Patent: Aug. 15, 1995

[54] COMPONENT CABINET

[75] Inventors: Paul Mazura, Karlsbad; Hans-Martin Schwenk, Straubenhardt, both of Germany

[73] Assignee: Schroff GmbH, Strabenhardt, Germany

[21] Appl. No.: 231,674

[22] Filed: Apr. 25, 1994

[30] Foreign Application Priority Data

Oct. 6, 1993 [DE] Germany ............... 43 33 947.6

[51] Int. Cl.⁶ ........................................... A47B 47/03
[52] U.S. Cl. ............................. 312/265.5; 312/265.6; 312/257.1
[58] Field of Search ........... 312/257.1, 263, 265.4, 312/265.5, 265.6, 265.1, 265.2; 52/36.5, 653.1, 261, 269

[56] References Cited

U.S. PATENT DOCUMENTS

| | | | |
|---|---|---|---|
| 2,480,568 | 8/1949 | Garvin | 312/265.5 |
| 3,307,894 | 3/1967 | Collier | 312/265.2 |
| 3,563,627 | 2/1971 | Whipps | 312/265.2 |
| 4,288,132 | 9/1981 | Znamirowski et al. | 312/265.5 |
| 4,910,932 | 3/1990 | Honigman | 52/653.1 |

FOREIGN PATENT DOCUMENTS

| | | |
|---|---|---|
| 0420491 | 4/1991 | European Pat. Off. |
| 0577433 | 1/1994 | European Pat. Off. |
| 244028 | 3/1987 | German Dem. Rep. |
| 7037254 | 6/1971 | Germany. |
| 9204135 | 8/1992 | Germany. |
| 4138887 | 4/1993 | Germany. |
| 1228231 | 4/1971 | United Kingdom. |
| 2052878 | 1/1981 | United Kingdom. |

OTHER PUBLICATIONS

Dr. Dirk Hesse: "Handbuch des 19"-Aufbausystems [Handbook of the 19 Component System], 1986, Markt & Technik Verlag, pp. 119–121.

Schroff GmbH catalogue, "Wir geben Elektronik Gestalt" [giving Form to Electronics], Sep. 1992, pp. 16.13–16.16.

Primary Examiner—Brian K. Green
Assistant Examiner—James O. Hansen
Attorney, Agent, or Firm—Spencer, Frank & Schneider

[57] ABSTRACT

A component cabinet for installing structural group carriers as well as housings of electronic and optoelectronic components and their accessories. The cabinet has a stand, side panels, floor panels, ceiling panels, a rear wall and a door, all disposed on a support base, and a cabinet base. Also provided are a rectangular frame having two vertical frame legs and a horizontal, upper connector and a horizontal, lower connector serves as the stand, two upper forward support arms and two lower, forward support arms protruding on the front side of the frame, and two upper, rear support arms and two lower, rear support arms protruding from the rear side of the frame. All of the support arms are attached in the region of the frame corners, all support arms are disposed parallel to one another and perpendicular to the plane of the frame, and the side panels, floor panels, ceiling panels, rear wall and the door are disposed on the support arms.

9 Claims, 2 Drawing Sheets

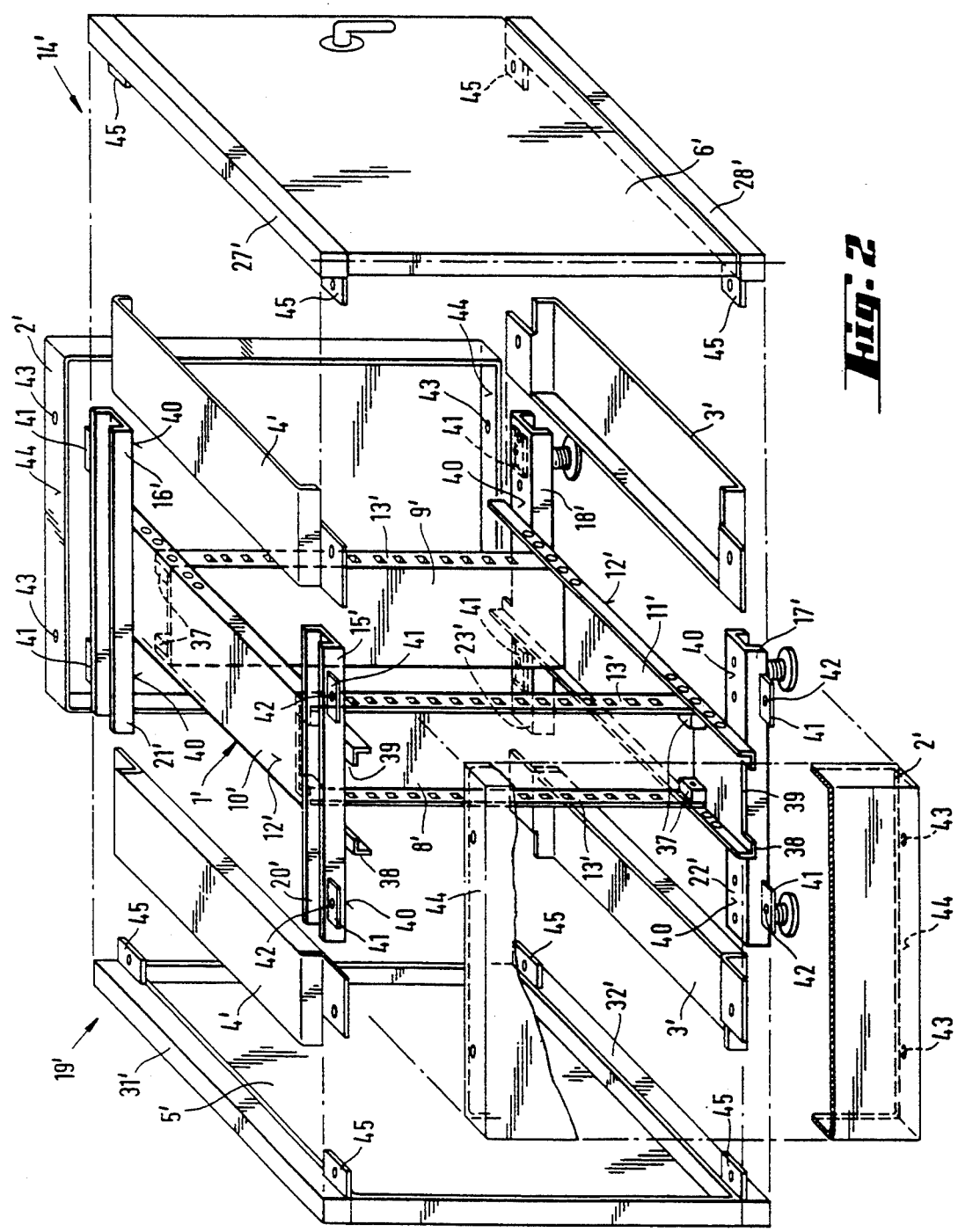

COMPONENT CABINET

CROSS-REFERENCE TO RELATED APPLICATION

This application claims the priority of patent application Ser. No. P 4333947.6, filed Oct. 6, 1993, in the Federal Republic of Germany, the subject matter of which is incorporated herein by reference.

BACKGROUND OF THE INVENTION

The invention relates to a component cabinet for installing structural group carriers and housings of electronic and optoelectronic components and their accessories, having a stand, having side panels, floor panels, ceiling panels, a rear wall and a door, all of which are disposed on the stand, and having a cabinet base.

The invention is used particularly in the field of construction and the operation of local networks in which high cabling densities are required.

Component cabinets for industrial electronics are known in which structural group carriers having electronics and conventional, electrical components, along with their wiring panels, the peripheral wire connection panel, ventilation and other accessories, are protected against dust, water and undesired contact with live parts. Their typical structure comprises a stand being rectangular in plan view, four posts, a ceiling piece and a floor piece in the form of a frame or respectively of four beams. The structural group carriers are secured in the mount. The closed cabinet results from all-around paneling with side and rear walls, a door and ceiling and floor sheets (Dr. Dirk Hesse, Handbuch des 19" Aufbausystems [Handbook of the 19" Component System], 1986, Markt & Technik Verlag, pp. 119-121). The panel parts listed are typically secured directly to the stand. Because the external cabling of the installed electronic components is not extensive, there is no problem with threading the few, relatively thin cable strands and guiding them to the outside through small openings, flaps or special through-openings.

The known component cabinets, with their characteristic structure that makes use of a paneled stand comprising posts and spars, are not suitable for the placement and distribution of large quantities of cable, or for cables with large diameters and therefore of little flexibility. The object, in connection with local area networks (LAN), is fulfilling the requirement of free access of large quantities of cable into the installation region of the electronic components and distribution plates (patch panels). Relatively stiff cables can no longer be threaded once inside the cabinets; nonetheless, to be able to guide them it is necessary to detach or dismount cabinet parts before placement, provided that such a procedure is even possible. The associated problems, time-consuming conditions and drawbacks caused by damage require no further explanations.

SUMMARY OF THE INVENTION

It is an object of the invention to conceptualize a component cabinet for the installation of structural group carriers, as well as housings and stands for electronic and electrical components that require high cable density, which cabinet takes into consideration all requirements of free access of the cables and cable strands into the installation region of the components.

To accomplish this, the point of departure is a component cabinet of the typical design described at the outset for the installation of structural group carriers, as well as housings of electronic and optoelectronic components and their accessories, with stand side panels, floor panels, ceiling panels, a rear wall and a door all being disposed on the stand, and having a cabinet base.

The object is attained in that a rectangular frame having two vertical frame legs and a lower horizontal connector serves as the stand, and that two upper, forward support arms and two lower, forward support arms protrude from the front side of the frame. Moreover, all of the support arms are respectively attached in the region of the frame corners and are parallel to one another and disposed perpendicular to the plane of the frame. Finally, the side panels, floor panels, ceiling panels, rear wall and door are disposed on the support arms.

The core of the invention can be seen in the wide, rectangular frame that functions as a component support cell. The structural group carriers and housings, etc. are inserted into the frame and secured; they are subsequently cabled from the front side and rear side. The cable harnesses can be brought near from below, from above and from both sides. Lastly, the component cell provided in this manner is made into a closed cabinet or row of cabinets through later attachment of the panel. Support arms of suitable length and that protrude at the front and back of the stand serve to secure the panel elements (the side panels, floor panels and ceiling panels, the rear wall and the door). These support arms permit the panel to be disposed and secured at a sufficient distance from the components installed into the frame while taking into consideration their extension, space-consuming cabling.

Of course, traveling assembly frames for the all-around accessible structure of experimental arrangements are known; for example, they are sold as "laboratory stands" (Schroff GmbH catalogue, "Wir geben Electronic Gestalt" [Giving Form to Electronics], 9/92, pp. 16.13, 16.14, 16.15 and 16.16). Later paneling of this laboratory stand is, however, not provided; it is not even possible due to the lack of fastening options for the panel pieces.

To achieve high stability of the frame, its two frame legs and two connectors have a U-profile with a broad U-back and short U-legs.

With respect to manufacturing technology, it is advantageous when the frame legs and the connectors are of equal width.

The U-legs of the frame legs and the connectors are advantageously oriented toward the inside of the frame. This measure increases the frame's resistance to distortion.

To obtain more space on the sides of the frame for placing cables or cable harnesses, the U-legs of the frame legs can be outwardly-oriented, and the U-legs of the connectors can be oriented toward the inside of the frame.

It is advisable for the U-legs of the frame legs to have rows of attachment holes. These attachment holes serve as auxiliary means for attaching the structural group carriers, housings and support floors.

In accordance with a further, vital feature of the invention, the frame legs can be detachable secured to the connectors. This allows the inside width of the frame for structural group carrier installation to be changed at an arbitrary point in time in order to permit adaptation of the interior of the component cabinet to the width of the structural group carriers or components.

Separate attachment elements are advisably provided for attaching the frame legs to the connectors. Screw holes that are also disposed on both sides can serve as attachment elements.

For the purpose of economical production of the component cabinet, all of the support arms can be supports made of commercially-available rectangular tubes of equal length.

However, the support arms can also be formed from bars of U-section that are attached by their backs to the connectors.

The height of the component cabinet can be reduced when the lower support arms form the support base and have height-adjustable screw bases.

The support arms attached to the frame will advisably have attachment means for the side panels, floor panels and ceiling panels.

In accordance with another feature of the invention, the free ends of the upper and lower support arms, respectively, that protrude from the front side of the frame, and the free ends of the upper and lower support arms, respectively, that protrude from the rear side of the frame, are respectively connected to one another by means of upper and lower attachment strips. These attachment strips contribute to the increase in stability of the frame, and they effectively prevent bending of the support arms when these are configured to be particularly long.

In an advantageous manner, the door is hinged at the top and bottom to the two attachment strips provided on the front side of the frame. The door can also be secured directly to an upper and a lower support arm.

The rear wall can be secured at the top and bottom to the two attachment strips provided on the rear side of the frame.

A side wall panel having an essentially U-shaped cross-section is advisably inserted parallel next to the two frame legs and between an upper support arm and a lower support arm, respectively.

A ceiling panel having a U-shaped cross-section is advantageously inserted on both sides of the horizontal, upper connector and, in its plane, respectively between two lower support arms.

A floor panel having a U-shaped cross-section can advantageously be inserted on both sides of the horizontal, lower connector and, in its plane, respectively between two lower support arms.

In one embodiment of the component cabinet, the two horizontal connectors protrude in their longitudinal direction from the vertical frame legs. This measure leads to an increase in the distance between the two frame legs on one side and the side panel on the other for the purpose of receiving cable harnesses.

To permit the feed of cables next to the frame from above or below, the two horizontal connectors have recesses on their narrow sides.

In a particularly advantageous feature of the invention, an outwardly-oriented attachment tab is disposed on each of the eight support arms. These attachment tabs permit the side panel to be secured at a selectable distance from the outside of the frame, depending on the dimensioning of the panel, thereby obtaining more space for placing even very thick cable harnesses.

The proposed, horizontally-disposed attachment tabs can have attachment means suitable for two adjacent panels or also for a single, one-piece side wall panel.

BRIEF DESCRIPTION OF THE DRAWINGS

The invention is described in detail below by way of two embodiments with reference to the two enclosed sheets of drawing Figures, wherein:

FIG. 2 shows a second embodiment of a component cabinet, likewise shown in perspective and in an exploded-type representation.

DETAILED DESCRIPTION OF THE PREFERRED EMBODIMENTS

Figure 1:
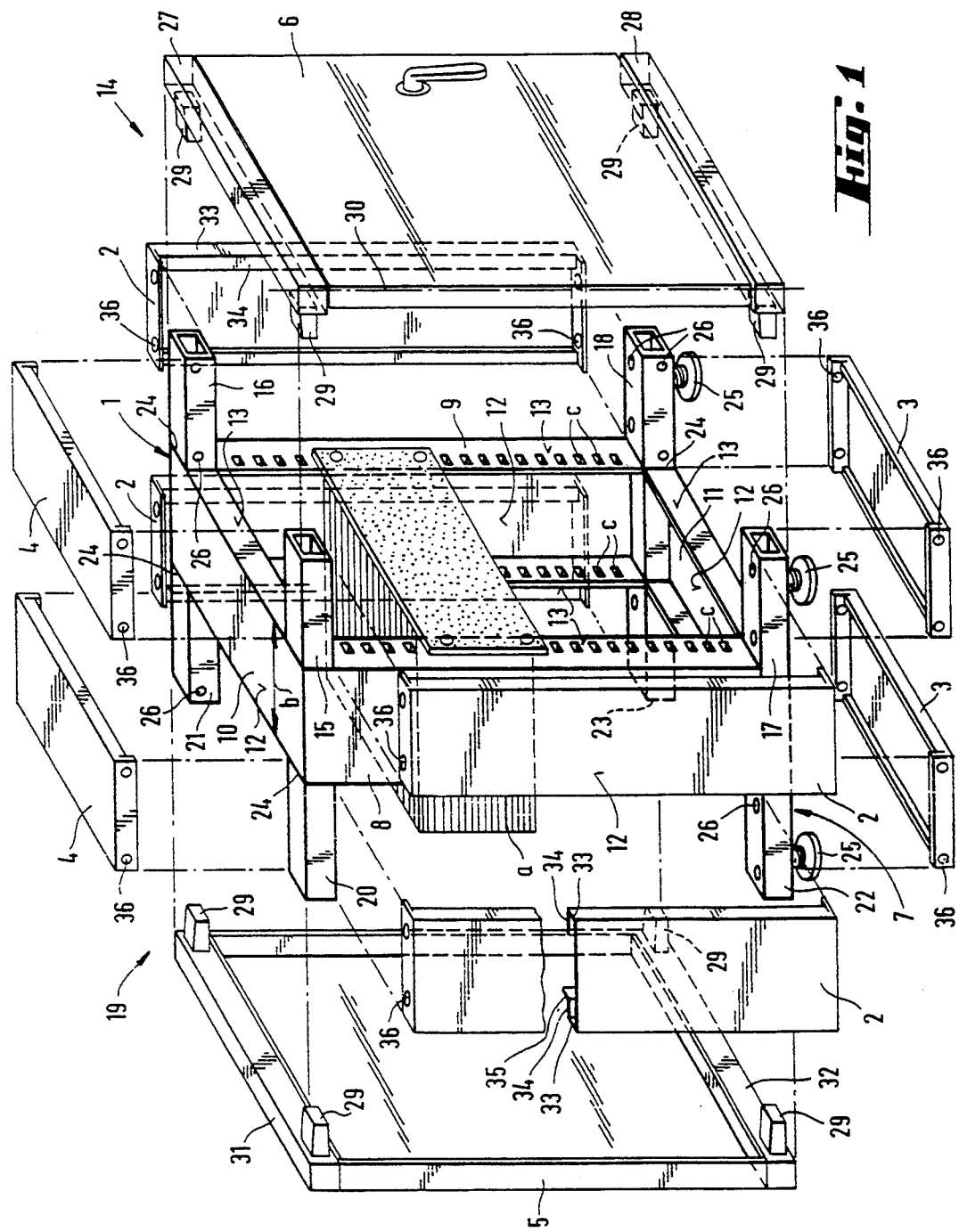
FIG. 1 shows a component cabinet in perspective and in an exploded-type representation.

The component cabinet shown in FIG. 1 is provided for the installation of structural group carriers and/or housings of electronic and optoelectronic components and their accessories, such as current suppliers, and essentially comprises a stand in the form of a frame 1 and a number of panel elements, namely side panels 2, floor panels 3, ceiling panels 4, a rear wall 5 and a door 6, and has a cabinet base 7.

The broad, rectangular frame 1 is composed of two vertical frame legs 8 and 9, a horizontal, upper connector 10 and a likewise horizontal, lower connector 11. The two frame legs 8 and 9 and the two connectors 10 and 11 are securely connected to one another, and are made of steel sheet; all of the parts have the same U-profile with a very wide U-back and two short U-legs 13 bent upward at a right angle. Frame legs 8, 9 and connectors 10, 11 are oriented toward the inside of the frame. The U-legs 13 of the vertical frame legs 8, 9 support rows of attachment holes c disposed in a standard grid and provided for attaching the structural group carriers and the components or slide rails or component supports.

FIG. 1 shows a simplified version of a structural group carrier a disposed between the two vertical frame legs 8, 9 in the frame. Its front plate, which protrudes laterally on both sides, is screwed on with the use of rectangular attachment holes c provided on U-legs 13.

Two upper, forward support arms 15 and 16, and two lower, forward support arms 17 and 18 protrude on the front side of frame 1, and two upper, rear support arms 20 and 21 and two lower, rear support arms 22, 23 protrude on rear side 19. All eight support arms 15 though 18 and 20 through 23 are attached at the corners 24 of frame 1, are parallel to one another and are disposed perpendicular to that plane of frame 1 which faces the front side 14 and the rear side 19 of the frame 1. Lower support arms 17, 18 and 22, 23 form (together with lower connector 11) cabinet base 7, and support height-adjustable screw bases 25. It is within the scope of the invention when each connector 11 or 12, together with its respective forward and rear support arms 15 through 18 or 20 through 23, is produced in one piece as a cast part having an H-shape in plan view, with the lower cast part forming cabinet base 7.

All eight support arms 15 through 18 and 20 through 23 are supports made of rectangular tubes and of equal length. They have attachment means 26 in the form of screw holes for the four side panels 2, the two floor panels 3 and the two ceiling panels 4.

The free ends of upper support arms 15 and 16 disposed on the front side 14 of the frame are connected to one another by means of an upper, forward attachment strip 27, and the free ends of lower support arms 17 and 18 are connected to one another by means of a lower, forward attachment strip 28. In order to produce the connection, the two attachment strips 27 and 28 have near their ends plugs 29 that are slightly conical on the side; these plugs are pressed into rectangular tubes that form support arms 15 through 18 and 20 through 23. The door 6, in the form of a hinged door having a door handle, is hinged at the top and bottom to these two attachment strips 27 and 28, as indicated by dot-dash pivoting axes 30.

The free ends of upper support arms 20 and 21 provided on rear side 19 of frame 1 are connected by an upper, rear attachment strip 31, and the ends of lower, rear support arms 22 and 23 are connected by means of a lower, rear attachment strip 32, which likewise has plugs 29. Rear wall 5 is screwed onto these two rear attachment strips 31 and 32.

The four side wall panels 2, which are of equal width and length, are made of steel sheet, and they have a shallow, U-shaped cross-section; the inwardly-oriented legs 33 of the U support edge strips 34, which are bent off at a right angle and are oriented toward one another. The lower edge strips 34 of the two rear side wall panels 2 are provided with rabbets 35 for rear wall 5. The rabbets are bent off in the opposite direction and at a right angle. Each side panel 2 is inserted parallel next to a frame leg 8 or 9, respectively, and between an upper support arm 15 or 16, respectively, and a lower support arm 17 or 18, respectively, and screwed on there.

The two ceiling panels 4, which are of identical size and made of steel sheet, have—like side wall panels 2—a shallow, U-shaped cross-section, and are inserted between respectively two upper, forward or rear support arms 15, 16 or 20, 21, on both sides of the horizontal, upper connector 10 and in its plane, and screwed on there with the use of aligned holes 36.

The two floor panels 3, whose dimensions and embodiment coincide with those of ceiling panels 4, are inserted and secured on both sides of lower connector 11 between respectively two lower support arms 17, 18 or 22, 23.

The component cabinet shown in FIG. 2 corresponds in principle to the one in FIG. 1; however, the two frame legs 8', 9' are detachably connected to connectors 10, 11', thus making the inside width of frame 1 adjustable. Cubic attachment elements 37 bent out of steel sheet and screwed on serve to connect frame legs 8', 9' to connectors 10', 11'. The U-legs 13' of the two frame legs 8', 9' are oriented outwardly, and those of the two connectors 10', 11 face inwardly, oriented toward one another.

In this embodiment of the component cabinet (in FIG. 2), frame 1' is mounted such that, in their longitudinal direction, the two horizontal connectors 10', 11' protrude slightly from vertical frame legs 8', 9'. In this instance, the two connectors 10', 11' have on their narrow sides 38 recesses 39, which are rectangular in plane view.

In this embodiment of the component cabinet, support arms 15' through 18' and 20' through 23', which protrude on front side 14' and rear side 19' of frame 11, are formed from U-profile rods of identical dimensions and attached by their backs 40 to U-backs 12' of horizontal connectors 10', 11'.

An outwardly-oriented attachment strip 41 is disposed on each of the eight support arms 15' through 18' and 20' through 23'. These attachment strips 41 are provided to secure one-piece side panels 2', and for this purpose are provided with holding means 42 in the form of holes and stud bolts that cooperate with corresponding counter elements 43 provided in edge strips 44 of side panel 2'. Attachment strips 41 can also be attached after cable installation.

The two floor panels 3' and the two ceiling panels 4' are, as in the component cabinet in FIG. 1, inserted between two support arms 17' and 18' 22' and 23' and 15' and 16', 20' and 21', respectively; for this purpose they are chamfered twice, at a right angle and in opposite directions, on their front edges.

Rear wall 5' and door 6' are secured or connected to two attachment strips 31', 32' or 27', 28', respectively, which are secured with the aid of longitudinally-extending edge strips 45 at the free ends of support arms 15' through 18' and 20' through 23'.

It will be understood that the above description of the present invention is susceptible to various modifications, changes and adaptations, and the same are intended to be comprehended within the meaning and range of equivalents of the appended claims.

What is claimed is:

1. In a component cabinet for accommodating structural group carriers, housings of electronic or optoelectronic components or accessories thereof, comprising
  (a) a stand formed of a rectangular frame having
    (1) two spaced, vertical frame legs;
    (2) a horizontal, upper connector interconnecting the frame legs at an upper end thereof and forming two upper corner regions with said frame legs;
    (3) a horizontal, lower connector interconnecting the frame legs at a lower end thereof and forming two lower corner regions with said frame legs;
    (4) front and rear sides; and
    (5) a frame plane facing said front and rear sides;
  (b) eight support arms each formed of cross-sectionally rectangular hollow members of identical lengths and each being perpendicular to said frame plane; each support arm extending from one of said corner regions and each having a free end; two of said eight support arms being upper, forward support arms extending towards the front side; two of said eight support arms being upper, rearward support arms extending towards the rear side; two of said eight support arms being lower, forward support arms extending towards the front side; and two of said eight support arms being lower, rearward support arms extending towards the rear side;
  (c) attachment means carried by each support arm;
  (d) an upper, forward attachment strip interconnecting the free ends of said upper, forward support arms;
  (e) an upper, rearward attachment strip interconnecting the free ends of said upper, rearward support arms;
  (f) a lower, forward attachment strip interconnecting the free ends of said lower, forward support arms;
  (g) a lower, rearward attachment strip interconnecting the free ends of said lower, rearward support arms;
  (h) a rear wall secured to said upper, rearward and said lower, rearward attachment strips;
  (i) a door secured to said upper, forward and said lower, forward attachment strips;
  (j) side panels attached to said attachment means;
  (k) floor panels attached to said attachment means; and
  (l) ceiling panels attached to said attachment means.

2. The component cabinet as defined in claim 1, wherein said frame legs and said connectors each have a profile shaped as a shallow U.

3. The component cabinet as defined in claim 2, wherein the U-profiles of the frame legs and the connectors are oriented toward one another.

4. The component cabinet as defined in claim 1, wherein said frame legs and said connectors have identical width dimensions measured perpendicularly to said plane.

5. The component cabinet as defined in claim 1, wherein said frame legs are each provided with a series of securing holes.

6. The component cabinet as defined in claim 1, wherein said lower, forward and said lower, rearward support arms together form a cabinet base; further comprising height-adjustable screw legs secured to said cabinet base.

7. The component cabinet as defined in claim 1, wherein said side panels have a U-shaped cross section, and further wherein said side panels extend vertically between said upper, forward and lower, forward support arms and between said upper, rearward and lower rearward support arms.

8. The component cabinet as defined in claim 1, wherein said ceiling panels have a U-shaped cross section and further wherein said ceiling panels extend horizontally on either side of said upper connector between said upper, forward support arms and between said upper, rearward support arms.

9. The component cabinet as defined in claim 1, wherein said bottom panels have a U-shaped cross section and further wherein said bottom panels extend horizontally on either side of said lower connector between said lower, forward support arms and between said lower, rearward support arms.

* * * * *